US011818833B2

(12) United States Patent
Cheng (10) Patent No.: US 11,818,833 B2
(45) Date of Patent: *Nov. 14, 2023

(54) CIRCUIT BOARD STRUCTURE

(71) Applicant: Unimicron Technology Corp., Taoyuan (TW)

(72) Inventor: Shih-Lian Cheng, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/867,624

(22) Filed: Jul. 18, 2022

(65) Prior Publication Data
US 2023/0156908 A1  May 18, 2023

Related U.S. Application Data

(60) Provisional application No. 63/279,661, filed on Nov. 15, 2021.

(30) Foreign Application Priority Data

Jun. 29, 2022  (TW) .................................. 111124284

(51) Int. Cl.
*H05K 1/02* (2006.01)
*H01L 23/498* (2006.01)
*H05K 1/14* (2006.01)

(52) U.S. Cl.
CPC ..... *H05K 1/0222* (2013.01); *H01L 23/49822* (2013.01); *H01L 23/49833* (2013.01);
(Continued)

(58) Field of Classification Search
CPC ...... H05K 1/0222; H05K 1/024; H05K 1/144; H05K 2201/0959; H05K 2201/09672;
(Continued)

(56) References Cited

U.S. PATENT DOCUMENTS 6,353,189 B1 * 3/2002 Shimada ........... H01L 23/49827
257/E23.105
7,420,126 B2 * 9/2008 Shibata .................. H05K 3/445
174/265
(Continued)

FOREIGN PATENT DOCUMENTS

CN  100367832  2/2008
CN  111316434  6/2020
(Continued)

*Primary Examiner* — Hoa C Nguyen
(74) *Attorney, Agent, or Firm* — JCIPRNET (57) ABSTRACT

A circuit board structure includes a substrate, a third dielectric layer, a fourth dielectric layer, a first external circuit layer, a second external circuit layer, a conductive through hole electrically connected to the first and second external circuit layers, a first annular retaining wall surrounding the conductive through hole, and a second annular retaining wall surrounding the conductive through hole. The first annular retaining wall is electrically connected to the first external circuit layer and a first inner circuit layer. The second annular retaining wall is electrically connected to the second external circuit layer and a second inner circuit layer. A first ground circuit, the first annular retaining wall, and the first inner circuit layer define a first ground path surrounding a first signal circuit. A second ground circuit, the second annular retaining wall, and the second inner circuit layer define a second ground path surrounding a second signal circuit.

10 Claims, 8 Drawing Sheets

(52) U.S. Cl.
CPC ............. *H05K 1/024* (2013.01); *H05K 1/144* (2013.01); *H05K 2201/098* (2013.01); *H05K 2201/0959* (2013.01); *H05K 2201/09672* (2013.01)

(58) Field of Classification Search
CPC ........ H05K 2201/098; H01L 23/49822; H01L 23/49833
See application file for complete search history.

(56) References Cited

U.S. PATENT DOCUMENTS

| | | | |
|---|---|---|---|
| 7,705,695 B2* | 4/2010 | Kushta | H05K 1/0222 333/204 |
| 7,868,257 B2* | 1/2011 | Kushta | H05K 1/0222 174/262 |
| 8,895,872 B2* | 11/2014 | Pai | H05K 1/0222 174/250 |
| 8,994,480 B2* | 3/2015 | Kushta | H05K 1/0251 333/204 |
| 9,635,761 B2 | 4/2017 | Brigham et al. | |
| 9,980,370 B2* | 5/2018 | Kashiwakura | H01P 5/085 |
| 11,324,119 B1* | 5/2022 | Dsilva | H05K 3/4038 |
| 2005/0230813 A1* | 10/2005 | Nakamura | H05K 1/0222 257/774 |
| 2011/0203842 A1* | 8/2011 | Russell | H05K 1/0222 29/829 |
| 2017/0150594 A1* | 5/2017 | Jones | H05K 1/0251 |
| 2022/0053640 A1* | 2/2022 | Zamarron | H05K 1/115 |

FOREIGN PATENT DOCUMENTS

| | | |
|---|---|---|
| TW | 201220967 | 5/2012 |
| TW | I365016 | 5/2012 |
| TW | I528871 | 4/2016 |

* cited by examiner

CIRCUIT BOARD STRUCTURE

CROSS-REFERENCE TO RELATED APPLICATION

This application claims the priority benefits of U.S. provisional application Ser. No. 63/279,661, filed on Nov. 15, 2021 and Taiwanese application no. 111124284, filed on Jun. 29, 2022. The entirety of each of the above-mentioned patent applications is hereby incorporated by reference herein and made a part of this specification.

BACKGROUND

Technical Field

The disclosure relates to a substrate structure. In particular, the disclosure relates to a circuit board structure.

Description of Related Art

In a conventional circuit board, the design of coaxial via requires one or more insulating layers formed through lamination and layer build-up between an inner conductor layer and an outer conductor layer to serve for blocking. Therefore, impedance mismatch may be present at two ends of the coaxial via and electromagnetic interference (EMI) that shields the gap may occur, influencing integrity of high-frequency signals.

SUMMARY

The disclosure provides a circuit board structure, effectively preventing energy loss and reducing noise interference, and achieving relatively high signal integrity.

In an embodiment of the disclosure, a circuit board structure includes a substrate, a third dielectric layer, a fourth dielectric layer, a first external circuit layer, a second external circuit layer, a conductive through hole, a first annular retaining wall, and a second annular retaining wall. The substrate has an opening and includes a first dielectric layer, a second dielectric layer, a first inner circuit layer, a second inner circuit layer, and a conductive connection layer. The opening penetrates the first dielectric layer. The first dielectric layer has a first surface and a second surface opposite to each other. The second dielectric layer fills the opening, and has a third surface and a fourth surface opposite to each other. The first inner circuit layer is disposed on the first surface. The second inner circuit layer is disposed on the second surface. The conductive connection layer covers an inner wall of the opening, and is connected to the first inner circuit layer and the second inner circuit layer. The third dielectric layer covers the first inner circuit layer and the third surface. The fourth dielectric layer covers the second inner circuit layer and the fourth surface. The first external circuit layer is disposed on the third dielectric layer, and includes a first signal circuit and a first ground circuit. The second external circuit layer is disposed on the fourth dielectric layer, and includes a second signal circuit and a second ground circuit. The conductive through hole penetrates the third dielectric layer, the second dielectric layer, and the fourth dielectric layer, and is electrically connected to the first external circuit layer and the second external circuit layer. The first annular retaining wall is disposed in the third dielectric layer, surrounds the conductive through hole, and is electrically connected to the first external circuit layer and the first inner circuit layer. The first ground circuit, the first annular retaining wall, and the first inner circuit layer define a first ground path. The first ground path surrounds the first signal circuit. The second annular retaining wall is disposed in the fourth dielectric layer, surrounds the conductive through hole, and is electrically connected to the second external circuit layer and the second inner circuit layer. The second ground circuit, the second annular retaining wall, and the second inner circuit layer define a second ground path. The second ground path surrounds the second signal circuit.

In an embodiment of the disclosure, the first signal circuit, the conductive through hole, and the second signal circuit define a signal path. The first ground circuit, the first annular retaining wall, the first inner circuit layer, the conductive connection layer, the second inner circuit layer, the second annular retaining wall, and the second ground circuit define a third ground path. The third ground path surrounds the signal path.

In an embodiment of the disclosure, the conductive through hole includes a via, a conductive material layer, and a filler material. The via penetrates the third dielectric layer, the second dielectric layer, and the fourth dielectric layer. The conductive material layer covers an inner wall of the via and is electrically connected to the first external circuit layer and the second external circuit layer. The filler material fills the via. The first external circuit layer and the second external circuit layer respectively cover an upper surface and a lower surface of the filler material. The upper surface and the lower surface are opposite to each other.

In an embodiment of the disclosure, each of the first ground path and the second ground path is a substantially U-shaped path.

In an embodiment of the disclosure, a circuit board structure includes two circuit board units and a connection structure layer. Each of the circuit board units includes a substrate, a third dielectric layer, a fourth dielectric layer, a first external circuit layer, a second external circuit layer, a conductive through hole, a first annular retaining wall, and a second annular retaining wall. The substrate has an opening and includes a first dielectric layer, a second dielectric layer, a first inner circuit layer, a second inner circuit layer, and a conductive connection layer. The opening penetrates the first dielectric layer. The first dielectric layer has a first surface and a second surface opposite to each other. The second dielectric layer fills the opening, and has a third surface and a fourth surface opposite to each other. The first inner circuit layer is disposed on the first surface. The second inner circuit layer is disposed on the second surface. The conductive connection layer covers an inner wall of the opening, and is connected to the first inner circuit layer and the second inner circuit layer. The third dielectric layer covers the first inner circuit layer and the third surface. The fourth dielectric layer covers the second inner circuit layer and the fourth surface. The first external circuit layer is disposed on the third dielectric layer, and includes a first signal circuit and a first ground circuit. The second external circuit layer is disposed on the fourth dielectric layer, and includes a second signal circuit and a second ground circuit. The conductive through hole penetrates the third dielectric layer, the second dielectric layer, and the fourth dielectric layer, and is electrically connected to the first external circuit layer and the second external circuit layer. The first annular retaining wall is disposed in the third dielectric layer, surrounds the conductive through hole, and is electrically connected to the first external circuit layer and the first inner circuit layer. The first ground circuit, the first annular retaining wall, and the first inner circuit layer define a first ground path. The first ground path surrounds the first signal circuit. The second annular retaining wall is disposed in the fourth dielectric layer, surrounds the conductive through hole, and is electrically connected to the second external circuit layer and the second inner circuit layer. The second ground circuit, the second annular retaining wall, and the second inner circuit layer define a second ground path. The second ground path surrounds the second signal circuit. The connection structure layer is disposed between the circuit board units, and is electrically and structurally connected to the first external circuit layers of the circuit board units to butt the circuit board units together. The first ground path of each of the circuit board units is connected through the connection structure layer and defines a third ground path.

In an embodiment of the disclosure, the connection structure layer includes a connection layer, a plurality of first conductive bonding parts, and a second conductive bonding part. The second conductive bonding part is disposed corresponding to the conductive through hole of each of the circuit board units and is connected to the first signal circuit. The first conductive bonding parts surround the second conductive bonding part and are connected to the first ground circuit.

In an embodiment of the disclosure, when the circuit board units are butted together, the second signal circuit, the conductive through hole, and the first signal circuit of one of the circuit board units, the second conductive bonding part, and the first signal circuit, the conductive through hole, and the second signal circuit of the other one of the circuit board units define a signal path. In addition, the second ground circuit, the second annular retaining wall, the second inner circuit layer, the conductive connection layer, the first inner circuit layer, the first annular retaining wall, and the first ground circuit of the one of the circuit board units, the first conductive bonding parts, and the first ground circuit, the first annular retaining wall, the first inner circuit layer, the conductive connection layer, the second inner circuit layer, the second annular retaining wall, and the second ground circuit of the other one of the circuit board units define a fourth ground path. The fourth ground path surrounds the signal path.

In an embodiment of the disclosure, when the circuit board units are butted together, the first inner circuit layer, the first annular retaining wall, and the first ground circuit of one of the circuit board units, the first conductive bonding parts, and the first ground circuit, the first annular retaining wall, and the first inner circuit layer of the other one of the circuit board units define the third ground path. The third ground path surrounds the first signal circuit of each of the circuit board units.

In an embodiment of the disclosure, the conductive through hole includes a via, a conductive material layer, and a filler material. The via penetrates the third dielectric layer, the second dielectric layer, and the fourth dielectric layer. The conductive material layer covers an inner wall of the via and is electrically connected to the first external circuit layer and the second external circuit layer. The filler material fills the via. The first external circuit layer and the second external circuit layer respectively cover an upper surface and a lower surface of the filler material. The upper surface and the lower surface are opposite to each other.

In an embodiment of the disclosure, each of the first ground path and the second ground path is a substantially U-shaped path.

Based on the foregoing, in the design of the circuit board structure according to the embodiments of the disclosure, the annular retaining wall surrounds the conductive through hole. The annular retaining wall is a closed-boundary-type enclosing structure, which reduces electromagnetic interference (EMI) and completely covers signals of the conductive through hole. Compared with the conventional technology in which a single row of blind holes with gaps are disposed around the conductive through hole, the circuit board structure according to the embodiments of the disclosure effectively prevents energy loss and reduces noise interference, and achieves relatively high signal integrity.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
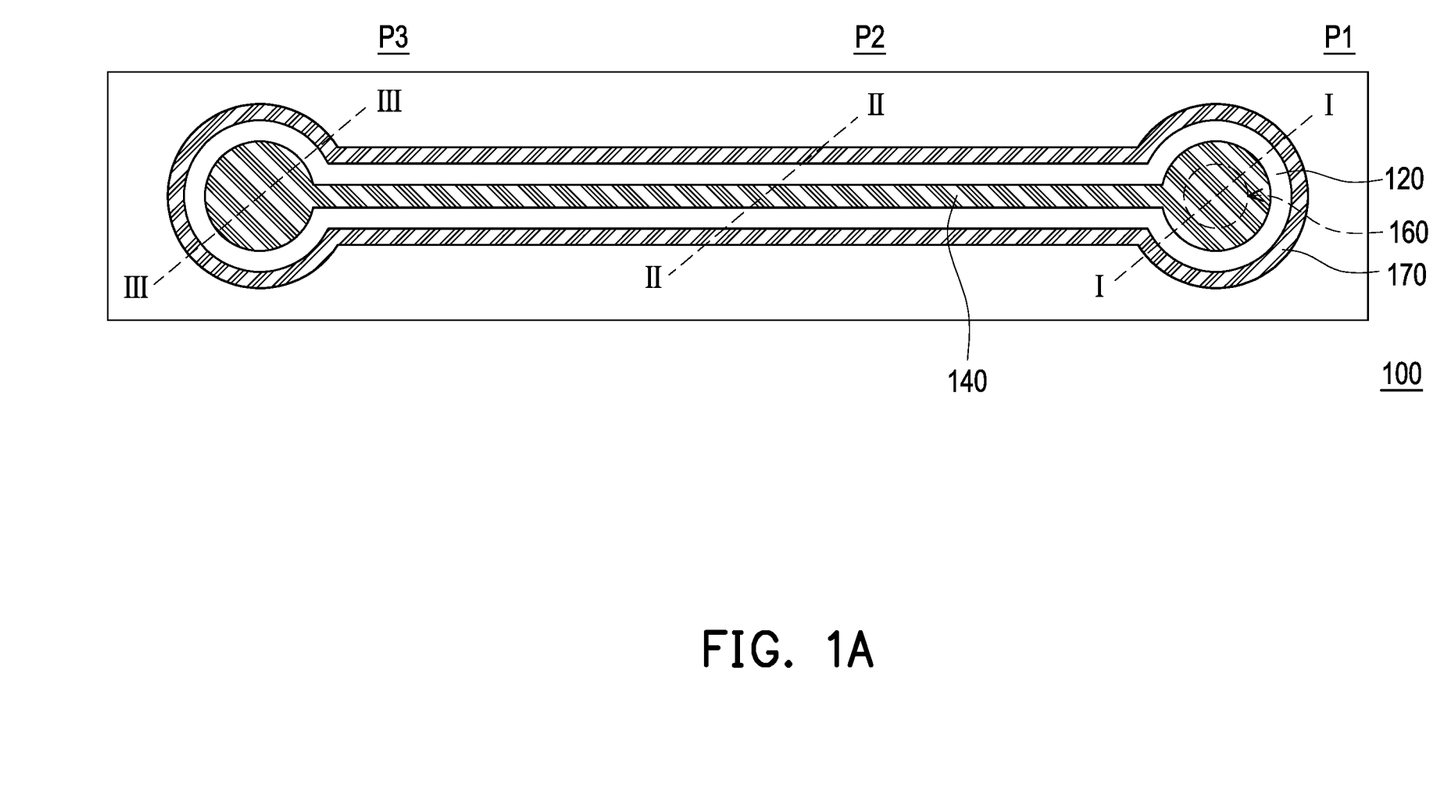
FIG. 1A is a schematic top view of a circuit board structure according to an embodiment of the disclosure.
Figure 1B:
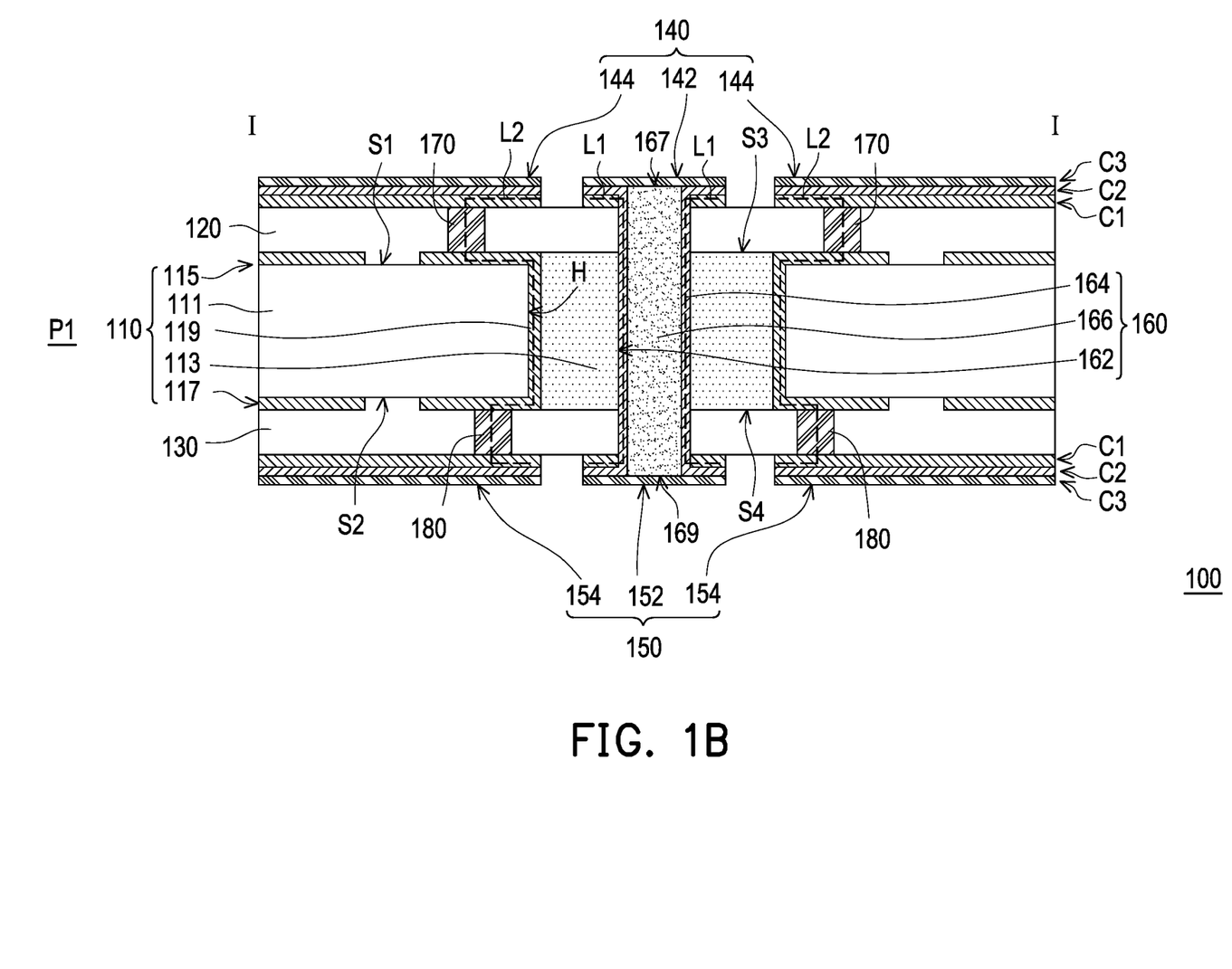
FIG. 1B is a schematic cross-sectional view along line I-I of FIG. 1A.
Figure 1C:
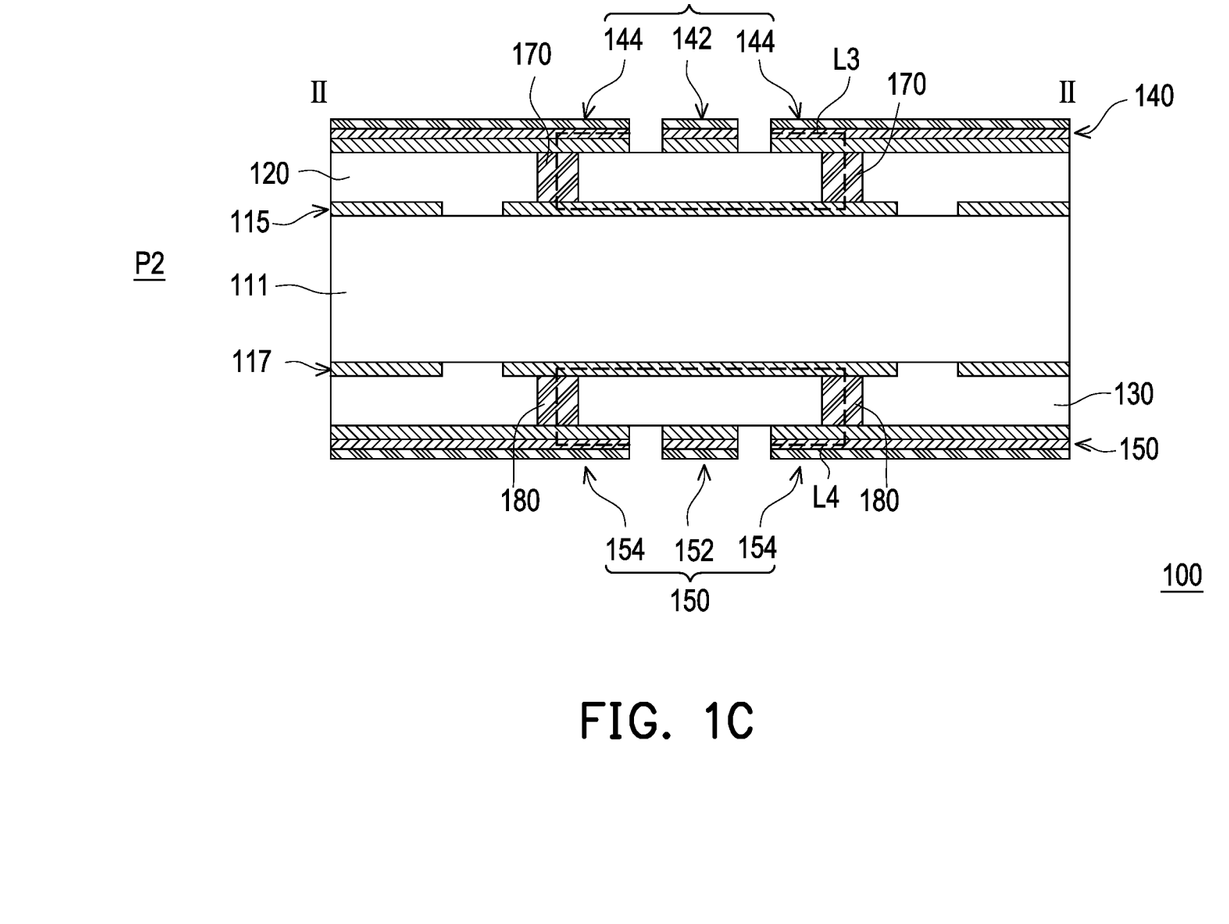
FIG. 1C is a schematic cross-sectional view along line II-II of FIG. 1A.
Figure 1D:
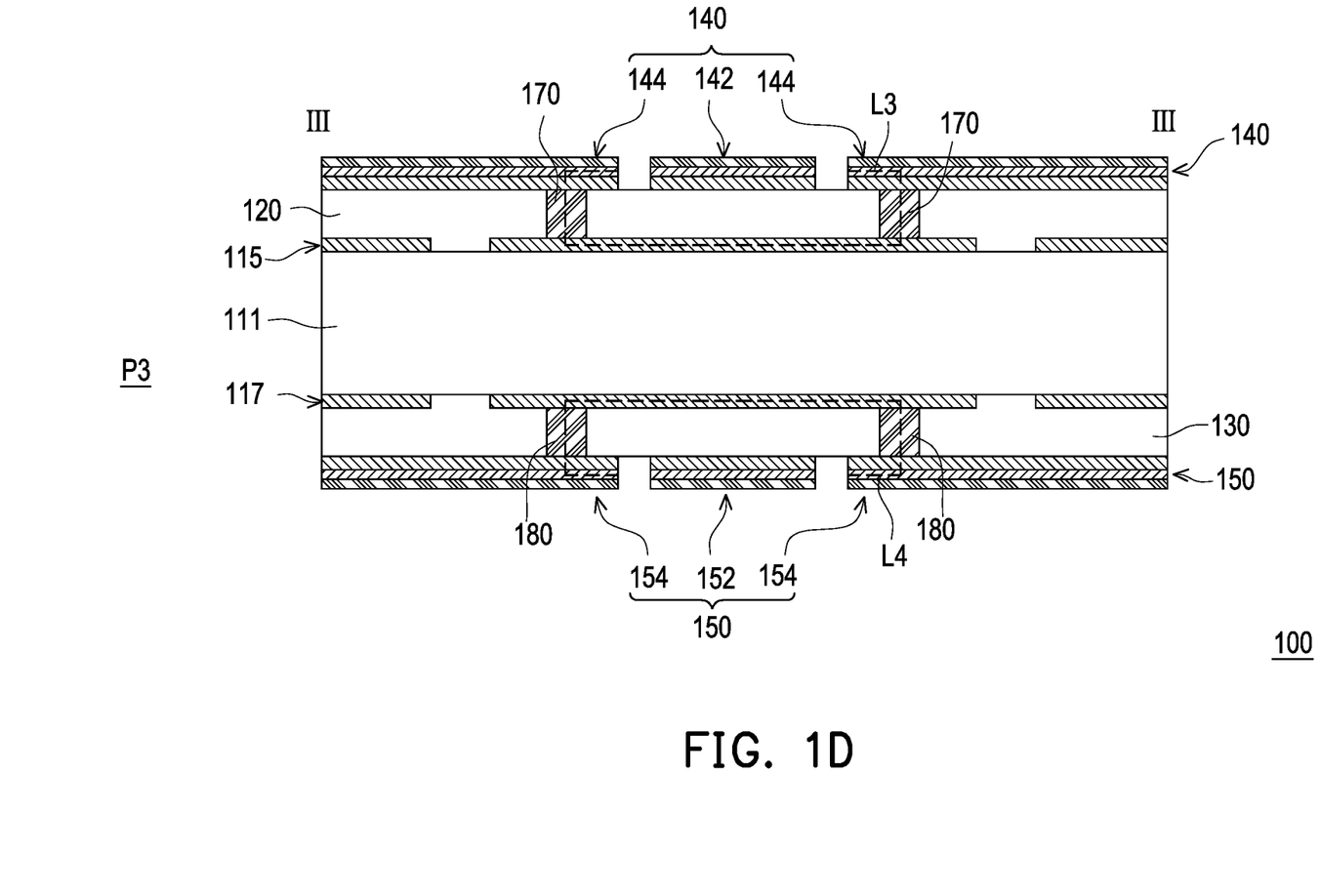
FIG. 1D is a schematic cross-sectional view along line III-III of FIG. 1A.
Figure 1E:
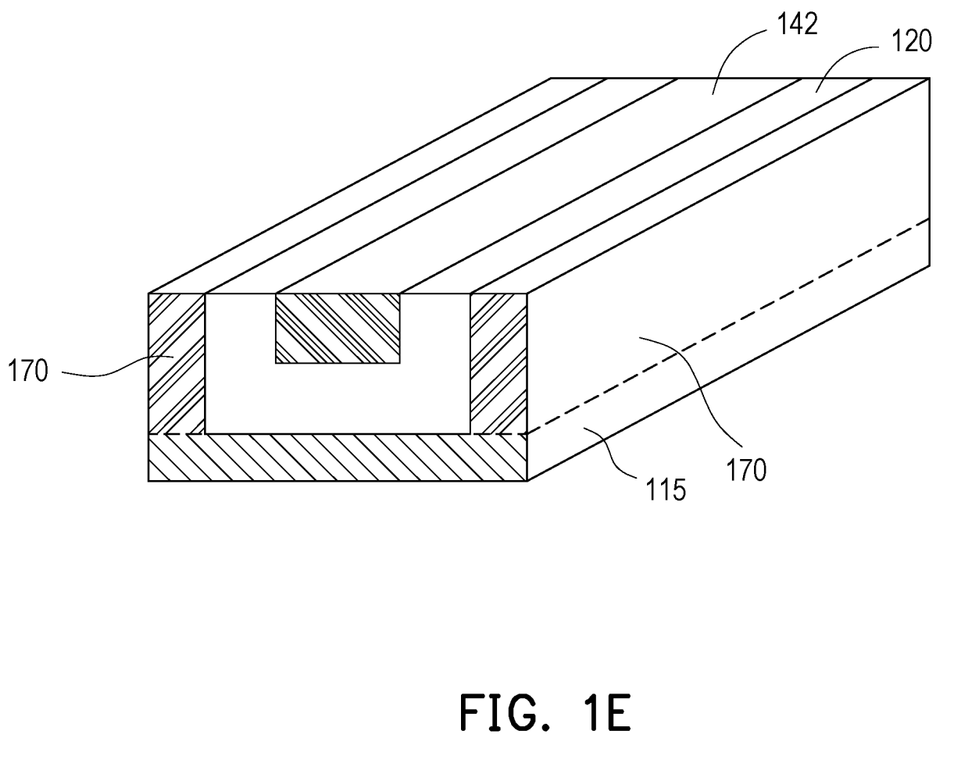
FIG. 1E is a partial perspective view at a second position of the circuit board structure of FIG. 1A.

FIG. 1A is a schematic top view of a circuit board structure according to an embodiment of the disclosure. FIG. 1B is a schematic cross-sectional view along line I-I of FIG. 1A. FIG. 1C is a schematic cross-sectional view along line II-II of FIG. 1A. FIG. 1D is a schematic cross-sectional view along line III-III of FIG. 1A. FIG. 1E is a partial perspective view at a second position of the circuit board structure of FIG. 1A. It should be noted that FIG. 1B is a schematic cross-sectional view at a first position P1 of the circuit board structure, FIG. 1C is a schematic cross-sectional view at a second position P2 of the circuit board structure, and FIG. 1D is a schematic cross-sectional view at a third position P3 of the circuit board structure.

With reference to FIG. 1A, FIG. 1B, FIG. 1C, and FIG. 1D together, in this embodiment, a circuit board structure 100 includes a substrate 110, a third dielectric layer 120, a fourth dielectric layer 130, a first external circuit layer 140, a second external circuit layer 150, a conductive through hole 160, a first annular retaining wall 170, and a second annular retaining wall 180.

To be specific, in this embodiment, the substrate 110 has an opening H, and includes a first dielectric layer 111, a second dielectric layer 113, a first inner circuit layer 115, a second inner circuit layer 117, and a conductive connection layer 119. The opening H penetrates the first dielectric layer 111. The first dielectric layer 111 has a first surface S1 and a second surface S2 opposite to each other. The first inner circuit layer 115 is disposed on the first surface S1 of the first dielectric layer 111, and the second inner circuit layer 117 is disposed on the second surface S2 of the first dielectric layer 111. The conductive connection layer 119 covers an inner wall of the opening H and is connected to the first inner circuit layer 115 and the second inner circuit layer 117. The second dielectric layer 113 fills the opening H. The second dielectric layer 113 has a third surface S3 and a fourth surface S4 opposite to each other. The third surface S3 and the fourth surface S4 are respectively aligned with the first inner circuit layer 115 and the second inner circuit layer 117. Here, a general dielectric material may be adopted for the first dielectric layer 111. The dielectric constant of the first dielectric layer 111 may be lower than 4.0, and the dielectric loss (DO of the first dielectric layer 111 may be lower than 0.01, accordingly providing proper impedance matching. The dielectric constant of the second dielectric layer 113 may be lower than 5.0, and the dielectric loss (DO of the second dielectric layer 113 may be greater than 0 and less than 0.025, not only providing proper insulation and impedance matching, but also reducing the dielectric loss.

Moreover, the third dielectric layer 120 of this embodiment covers the first inner circuit layer 115 and the third surface S3 of the second dielectric layer 113. The fourth dielectric layer 130 covers the second inner circuit layer 117 and the fourth surface S4 of the second dielectric layer 113. The first external circuit layer 140 is disposed on the third dielectric layer 120, and the second external circuit layer 150 is disposed on the fourth dielectric layer 130. The conductive through hole 160 penetrates the third dielectric layer 120, the second dielectric layer 113, and the fourth dielectric layer 130, and is electrically connected to the first external circuit layer 140 and the second external circuit layer 150. The conductive through hole 160 includes a via 162, a conductive material layer 164, and a filler material 166. The via 162 penetrates the third dielectric layer 120, the second dielectric layer 113, and the fourth dielectric layer 130. The conductive material layer 164 covers an inner wall of the via 162 and is electrically connected to the first external circuit layer 140 and the second external circuit layer 150. The filler material 166 fills the via 162. The first external circuit layer 140 and the second external circuit layer 150 respectively cover an upper surface 167 and a lower surface 169 of the filler material 166. The upper surface 167 and the lower surface 169 are opposite to each other. Here, the first external circuit layer 140 and the second external circuit layer 150 are each a multi-layer structure layer composed of a copper foil layer C1, a copper plating layer C2, and a mask layer C3. The copper plating layer C2 is located between the copper foil layer C1 and the mask layer C3. The copper plating layer C2 and the conductive material layer 164 are in the same film layer. The mask layer C3 is a copper layer, for example but not limited thereto, and covers the upper surface 167 and the lower surface 169 of the filler material 166.

In this embodiment, the first annular retaining wall 170 is buried in the third dielectric layer 120, surrounds the conductive through hole 160, and is electrically connected to the first external circuit layer 140 and the first inner circuit layer 115. The second annular retaining wall 180 is buried in the fourth dielectric layer 130, surrounds the conductive through hole 160, and is electrically connected to the second external circuit layer 150 and the second inner circuit layer 117. In particular, with reference to FIG. 1C, FIG. 1D, and FIG. 1E, the first ground circuit 144, the first annular retaining wall 170, and the first inner circuit layer 115 define a ground path L3 (i.e., a first ground path). The ground path L3 surrounds the first signal circuit 142 and presents close-ended enclosure, thus forming a relatively high-frequency and high-speed circuit. The second ground circuit 154, the second annular retaining wall 180, and the second inner circuit layer 117 define a ground path L4 (i.e., a second ground path). The ground path L4 surrounds the second signal circuit 152 and presents a close-ended enclosure, thus forming a relatively high-frequency and high-speed circuit. Here, each of the ground path L3 and the ground path L4 is a substantially U-shaped path.

Then, with reference to FIG. 1B, the first external circuit layer 140, the conductive through hole 160, and the second external circuit layer 150 define a signal path L1. The first external circuit layer 140, the first annular retaining wall 170, the first inner circuit layer 115, connecting circuit layer 119, the second inner circuit layer 117, the second annular retaining wall 180, and the second external circuit layer 150 define a ground path L2 (i.e., a third ground path). The ground path L2 surrounds the signal path L1. More specifically, the first external circuit layer 140 includes a first signal circuit 142 and a first ground circuit 144. The second external circuit layer 150 includes a second signal circuit 152 and a second ground circuit 154. The first signal circuit 142, the conductive through hole 160, and the second signal circuit 152 define the signal path L1. The first ground circuit 144, the first annular retaining wall 170, the first inner circuit layer 115, the conductive connection layer 119, the second inner circuit layer 117, the second annular retaining wall 180, and the second ground circuit 154 define the ground path L2. The ground path L2 surrounds the signal path L1. Since the signal path L1 is surrounded by the ground path L2 and a close-ended enclosure is presented, a relatively high-frequency and high-speed circuit can be formed.

In terms of process, if the third dielectric layer 120 and the fourth dielectric layer 130 are photoimageable dielectric (PID) materials, for example, they may be first performed with dry-film lamination on opposite sides of the substrate 110. In addition, closed-type grooves with a width of 100 microns and a diameter of 600 microns, for example, may respectively be formed on the third dielectric layer 120 and the fourth dielectric layer 130 through a photolithography process. Alternatively, if the third dielectric layer 120 and the fourth dielectric layer 130 are pre-pregs or Ajinomoto build-up films (ABF), for example, closed-type grooves with a width of 100 microns and a diameter of 600 microns, for example, may respectively be formed on the third dielectric layer 120 and the fourth dielectric layer 130 by laser ablation. Next, a conductive metal adhesive (e.g., a conductive copper paste) is coated in the grooves by transient liquid phase sintering (TLPS) and air-dried, which achieves electrical and thermal conductivity, and is suitable for bonding with any metal materials, and may not be transformed back into the liquid state due to being heated. Accordingly, the manufacturing of the first annular retaining wall 170 and the second annular retaining wall 180 is completed.

It should be noted that, in this embodiment, the first annular retaining wall 170 and the second annular retaining wall 180 are formed by filling conductive pastes in the third dielectric layer 120 and the fourth dielectric layer 130. Therefore, the first annular retaining wall 170 and the second annular retaining wall 180 are each a solid retaining wall structure, but not limited thereto. The conductive material of the annular retaining walls may also be a metal electroplating layer or a chemical plating metal layer. In another embodiment not shown, the first annular retaining wall and the second annular retaining wall may also be formed with a metal electro-plating layer, a chemical plating metal layer, or a metal conductive paste in the third dielectric layer and the fourth dielectric layer. Therefore, the first retaining wall and the second annular retaining wall may each be a groove-shaped retaining wall structure, which still falls within the scope of the disclosure.

Briefly, in this embodiment, the signal path L1 defined by the first signal circuit 142, the conductive through hole 160, and the second signal circuit 152 is surrounded and enclosed by the ground path L2 defined by the first ground circuit 144, the first annular retaining wall 170, the first inner circuit layer 115, the conductive connection layer 119, the second inner circuit layer 117, the second annular retaining wall 180, and the second ground circuit 154. In other words, the ground path L2 with closure properties is disposed around the signal path L1 that may transmit high-frequency and high-speed signals, such as 5G signals. Accordingly, a relatively high-frequency and high-speed circuit is formed, so that the circuit board structure 100 of this embodiment achieves relatively high signal integrity. Here, the high frequency refers to a frequency greater than 1 GHz, and the high speed refers to a data transmission speed greater than 100 Mbps.

Moreover, the first annular retaining wall 170 and the second annular retaining wall 180 are closed-boundary-type closed structures, and may thus completely cover signals of the conductive through hole 160. Compared with the conventional technology in which a single row of blind holes with gaps are disposed around the conductive through hole, the circuit board structure 100 of this embodiment effectively prevents energy loss and reduces noise interference, and achieves relatively high signal integrity. In addition, the conductive through hole 160, the conductive connection layer 119, and the second dielectric layer 113 define a coaxial via. The second dielectric layer 113 is located between the conductive through hole 160 and the conductive connection layer 119. Compared with the conventional technology of layer build-up in which the inner conductor layer and the outer conductor layer of the coaxial via are blocked by laminating insulating layers, the manufacturing of the circuit board structure 100 of this embodiment prevents influences on integrity of high-frequency signals due to impedance mismatch.

Figure 2A:
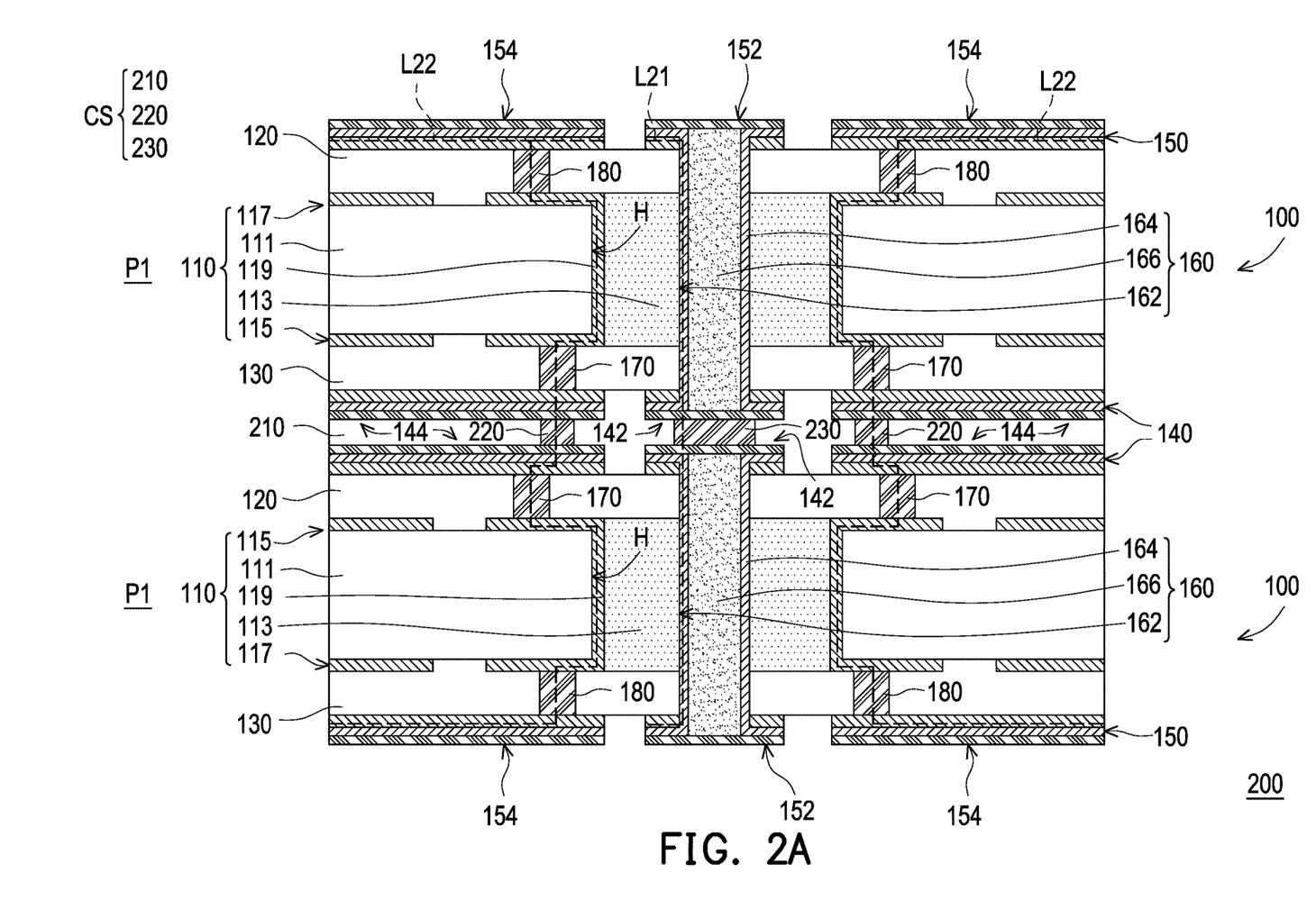
FIG. 2A is a schematic cross-sectional view of circuit board structures butted at a first position according to another embodiment of the disclosure.
Figure 2B:
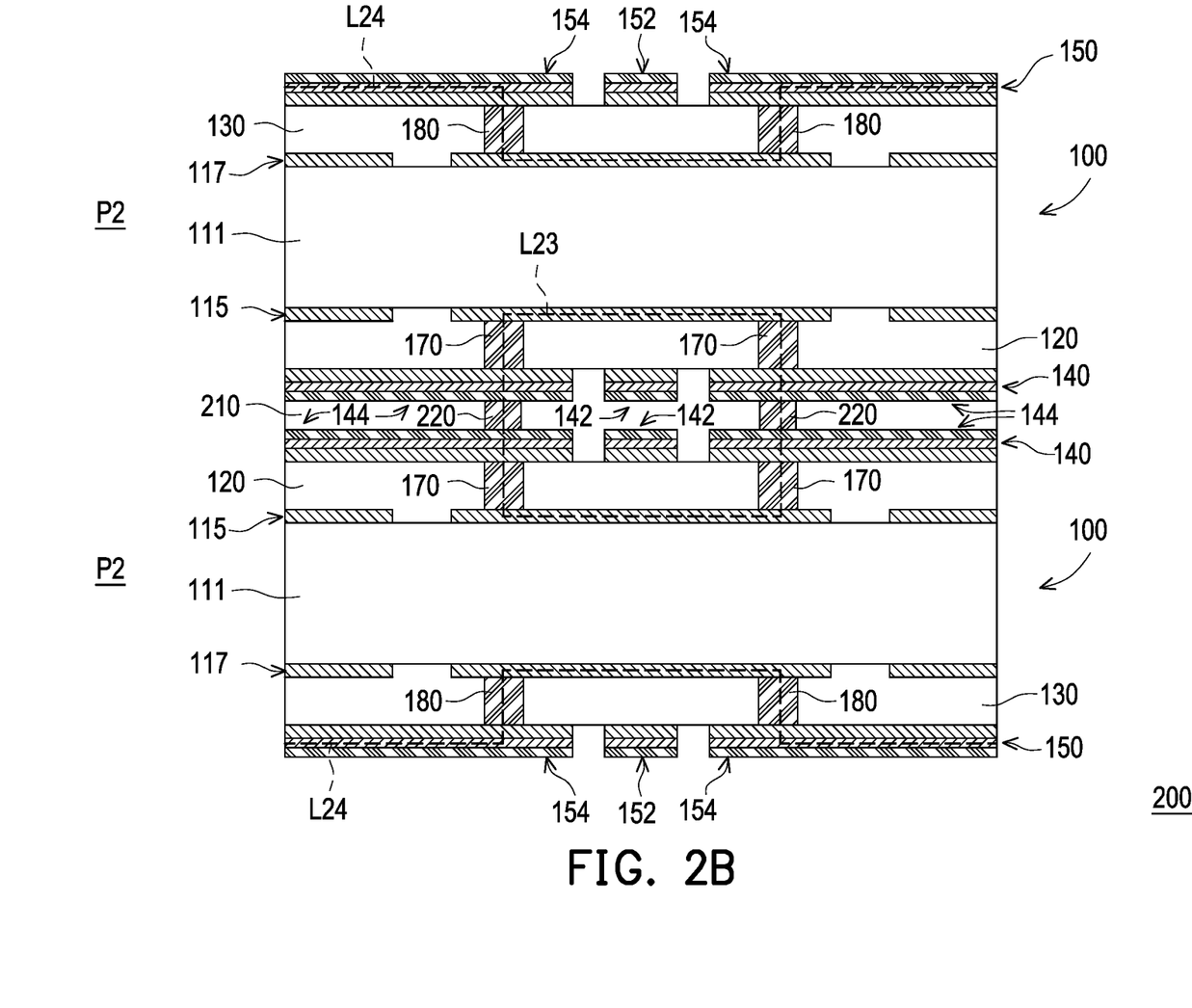
FIG. 2B is a schematic cross-sectional view of the circuit board structures of FIG. 2A butted at a second position.

FIG. 2A is a schematic cross-sectional view of circuit board structures butted at a first position according to another embodiment of the disclosure. FIG. 2B is a schematic cross-sectional view of the circuit board structures of FIG. 2A butted at a second position. With reference to FIG. 2A and FIG. 2B together, in this embodiment, a circuit board structure 200 includes two circuit board units and a connection structure layer CS. Each circuit board unit is namely the circuit board structure 100 in FIG. 1B. The connection structure layer CS is disposed between the circuit board structures 100, and is electrically and structurally connected to the first external circuit layer 140 of each circuit board structure 100 to butt the two circuit board structures 100 together. Here, the first position P1 and the second position P2 of the upper circuit board structure 100 are respectively butted to the first position P1 and the second position P2 of the lower circuit board structure 100. In particular, the ground path L3 (i.e., the first ground path with reference to FIG. 1C) of each circuit board structure 100 is connected through the connection structure CS and defines a ground path L23 (i.e., a third ground path).

To be specific, in this embodiment, the connection structure layer CS includes a connection layer 210, a plurality of first conductive bonding parts 220, and a second conductive bonding part 230. The second conductive bonding part 230 is disposed corresponding to the conductive through hole 160 of each circuit board structure 100 and is connected to the first signal circuit 142. The first conductive bonding parts 220 surround the second conductive bonding part 230 and are connected to the first ground circuit 144.

As shown in FIG. 2A, when the circuit board structures 100 are butted together, the second signal circuit 152, the conductive through hole 160, and the first signal circuit 142 of the upper circuit board structure 100, the second conductive bonding part 230, and the first signal circuit 142, the conductive through hole 160, and the second signal circuit 152 of the lower circuit board structure 100 define a signal path L21. The second ground circuit 154, the second annular retaining wall 180, the second inner circuit layer 117, the conductive connection layer 119, the first inner circuit layer 115, the first annular retaining wall 170, and the first ground circuit 144 of the upper circuit board structure 100, the first conductive bonding parts 220, and the first ground circuit 144, the first annular retaining wall 170, the first inner circuit layer 115, the conductive connection layer 119, the second inner circuit layer 117, the second annular retaining wall 180, and the second ground circuit 154 of the lower circuit board structure 100 define a ground path L22 (i.e., a fourth ground path). The ground path L22 surrounds the signal path L21. Since the signal path L21 is surrounded by the ground path L22 and a close-ended enclosure is presented, a relatively high-frequency and high-speed circuit can be formed.

Moreover, as shown in FIG. 2B, the second ground circuit 154, the second annular retaining wall 180, and the second inner circuit layer 117 of the upper circuit board structure 100 define a ground path L24 (i.e., a second ground path). Also, the ground path L24 surrounds the second signal circuit 152 and presents a close-ended enclosure, thus forming a relatively high-frequency and high-speed circuit. Here, the ground path L24 is a substantially U-shaped path. In addition, the first inner circuit layer 115, the first annular retaining wall 170, and the first ground circuit 144 of the upper circuit board structure 100, the first conductive bonding parts 220, and the first ground circuit 144, the first annular retaining wall 170, and the first inner circuit layer 115 of the lower circuit board structure 100 define a third ground path L23. Also, the third ground path L23 surrounds the first signal circuit 142 of each circuit board structure 100 and presents a close-ended enclosure, thus forming a relatively high-frequency and high-speed circuit. Furthermore, the second ground circuit 154, the second annular retaining wall 180, and the second inner circuit layer 117 of the lower circuit board structure 100 define the ground path L24 (i.e., the second ground path). Also, the ground path L24 surrounds the second signal circuit 152 and presents a close-ended enclosure, thus forming a relatively high-frequency and high-speed circuit. Here, the ground path L24 is a substantially U-shaped path.

It should be noted that the butting described in the embodiments above is butting the first external circuit layers located in the same position of the two circuit board structures together. Nonetheless, in other embodiments of butting not shown, it may also be possible to butt the first external circuit layer of one circuit board structure to the second external circuit layer of the other circuit board structure; or but the second external circuit layers of the two circuit board structures together; or butt the two circuit board structures located in different positions together through the connection structure layer, all of which fall within the scope of the disclosure.

Figure 3:
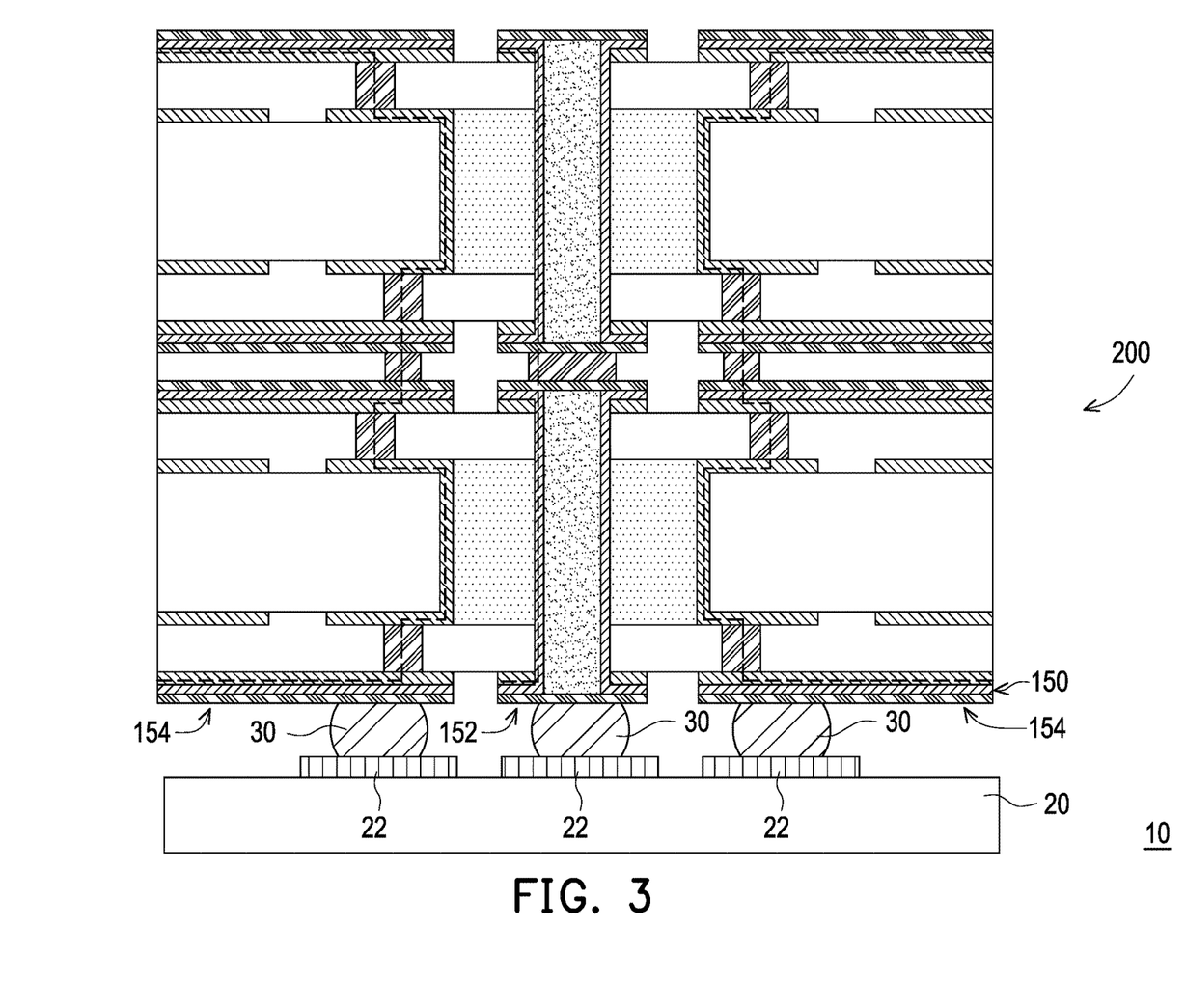
FIG. 3 is a schematic partial cross-sectional view of an electronic device including the circuit board structure of FIG. 2A.

FIG. 3 is a schematic partial cross-sectional view of an electronic device including the circuit board structure of FIG. 2A. With reference to FIG. 3, in this embodiment, an electronic device 10 includes an electronic element 20 and the circuit board structure 100 of FIG. 2A, for example. The electronic element 20 is electrically connected to the circuit board structure 200, and the electronic element 20 includes a plurality of pads 22. In addition, the electronic device 10 of this embodiment further includes a plurality of connectors 30 disposed between the second external circuit layer 150 of the circuit board structure 200 and the pads 22 of the electronic element 20. The electronic element 20 is electrically connected to the circuit board structure 200 through the connectors 30. Here, the connectors 30 are solder balls, for example but not limited thereto. In terms of application, an antenna structure may be disposed on the other side of the circuit board structure 200 opposite to the electronic element 20, which addresses signal interference on the same plane, and reduces energy loss of signals and noise interference, improving reliability of signal transmission.

In summary of the foregoing, in the design of the circuit board structure according to the embodiments of the disclosure, the annular retaining wall surrounds the conductive through hole. The annular retaining wall is a closed-boundary-type enclosing structure, which reduces electromagnetic interference (EMI) and completely covers signals of the conductive through hole. Compared with the conventional technology in which a single row of blind holes with gaps are disposed around the conductive through hole, the circuit board structure according to the embodiments of the disclosure effectively prevents energy loss and reduces noise interference, and achieves relatively high signal integrity.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit board structure comprising:
   a substrate having an opening penetrating the first dielectric layer, and the substrate comprising:
      a first dielectric layer having a first surface and a second surface opposite to each other;
      a second dielectric layer filling the opening, the second dielectric layer having a third surface and a fourth surface opposite to each other;
      a first inner circuit layer disposed on the first surface;
      a second inner circuit layer disposed on the second surface; and
      a conductive connection layer covering an inner wall of the opening, the conductive connection layer being connected to the first inner circuit layer and the second inner circuit layer;
   a third dielectric layer covering the first inner circuit layer and the third surface;
   a fourth dielectric layer covering the second inner circuit layer and the fourth surface;
   a first external circuit layer disposed on the third dielectric layer, the first external circuit layer comprising a first signal circuit and a first ground circuit;
   a second external circuit layer disposed on the fourth dielectric layer, the second external circuit layer comprising a second signal circuit and a second ground circuit;
   a conductive through hole penetrating the third dielectric layer, the second dielectric layer, and the fourth dielectric layer, the conductive through hole being electrically connected to the first external circuit layer and the second external circuit layer;
   a first annular retaining wall disposed in the third dielectric layer, surrounding the conductive through hole, and being electrically connected to the first external circuit layer and the first inner circuit layer, wherein the first ground circuit, the first annular retaining wall, and the first inner circuit layer define a first ground path, and the first ground path surrounds the first signal circuit; and
   a second annular retaining wall disposed in the fourth dielectric layer, surrounding the conductive through hole, and being electrically connected to the second external circuit layer and the second inner circuit layer, wherein the second ground circuit, the second annular retaining wall, and the second inner circuit layer define a second ground path, and the second ground path surrounds the second signal circuit.

2. The circuit board structure according to claim 1, wherein the first signal circuit, the conductive through hole, and the second signal circuit define a signal path; the first ground circuit, the first annular retaining wall, the first inner circuit layer, the conductive connection layer, the second inner circuit layer, the second annular retaining wall, and the second ground circuit define a third ground path; and the third ground path surrounds the signal path.

3. The circuit board structure according to claim 1, wherein the conductive through hole comprises:
   a via penetrating the third dielectric layer, the second dielectric layer, and the fourth dielectric layer;
   a conductive material layer covering an inner wall of the via, the conductive material layer being electrically connected to the first external circuit layer and the second external circuit layer; and
   a filler material filling the via, wherein the first external circuit layer and the second external circuit layer respectively cover an upper surface and a lower surface of the filler material, and the upper surface and the lower surface are opposite to each other.

4. The circuit board structure according to claim 1, wherein each of the first ground path and the second ground path is a substantially U-shaped path.

5. A circuit board structure comprising:
   two circuit board units, each of the circuit board units comprising:
      a substrate having an opening penetrating the first dielectric layer, and the substrate comprising:
         a first dielectric layer having a first surface and a second surface opposite to each other;
         a second dielectric layer filling the opening, the second dielectric layer having a third surface and a fourth surface opposite to each other;
         a first inner circuit layer disposed on the first surface;
         a second inner circuit layer disposed on the second surface; and
         a conductive connection layer covering an inner wall of the opening, the conductive connection layer being connected to the first inner circuit layer and the second inner circuit layer;
      a third dielectric layer covering the first inner circuit layer and the third surface;
      a fourth dielectric layer covering the second inner circuit layer and the fourth surface;

a first external circuit layer disposed on the third dielectric layer, the first external circuit layer comprising a first signal circuit and a first ground circuit;

a second external circuit layer disposed on the fourth dielectric layer, the second external circuit layer comprising a second signal circuit and a second ground circuit;

a conductive through hole penetrating the third dielectric layer, the second dielectric layer, and the fourth dielectric layer, the conductive through hole being electrically connected to the first external circuit layer and the second external circuit layer;

a first annular retaining wall disposed in the third dielectric layer, surrounding the conductive through hole, and being electrically connected to the first external circuit layer and the first inner circuit layer, wherein the first ground circuit, the first annular retaining wall, and the first inner circuit layer define a first ground path, and the first ground path surrounds the first signal circuit; and a second annular retaining wall disposed in the fourth dielectric layer, surrounding the conductive through hole, and being electrically connected to the second external circuit layer and the second inner circuit layer, wherein the second ground circuit, the second annular retaining wall, and the second inner circuit layer define a second ground path, and the second ground path surrounds the second signal circuit; and a connection structure layer disposed between the circuit board units, the connection structure layer being electrically and structurally connected to the first external circuit layers of the circuit board units to butt the circuit board units together, wherein the first ground path of each of the circuit board units is connected through the connection structure layer and defines a third ground path.

6. The circuit board structure according to claim 5, wherein the connection structure layer comprises a connection layer, a plurality of first conductive bonding parts, and a second conductive bonding part; the second conductive bonding part is disposed corresponding to the conductive through hole of each of the circuit board units and is connected to the first signal circuit; and the first conductive bonding parts surround the second conductive bonding part and are connected to the first ground circuit.

7. The circuit board structure according to claim 6, wherein when the circuit board units are butted together, the second signal circuit, the conductive through hole, and the first signal circuit of one of the circuit board units, the second conductive bonding part, and the first signal circuit, the conductive through hole, and the second signal circuit of the other one of the circuit board units define a signal path;

the second ground circuit, the second annular retaining wall, the second inner circuit layer, the conductive connection layer, the first inner circuit layer, the first annular retaining wall, and the first ground circuit of the one of the circuit board units, the first conductive bonding parts, and the first ground circuit, the first annular retaining wall, the first inner circuit layer, the conductive connection layer, the second inner circuit layer, the second annular retaining wall, and the second ground circuit of the other one of the circuit board units define a fourth ground path; and the fourth ground path surrounds the signal path.

8. The circuit board structure according to claim 6, wherein when the circuit board units are butted together, the first inner circuit layer, the first annular retaining wall, and the first ground circuit of one of the circuit board units, the first conductive bonding parts, and the first ground circuit, the first annular retaining wall, and the first inner circuit layer of the other one of the circuit board units define the third ground path; and the third ground path surrounds the first signal circuit of each of the circuit board units.

9. The circuit board structure according to claim 5, wherein the conductive through hole comprises:

a via penetrating the third dielectric layer, the second dielectric layer, and the fourth dielectric layer;

a conductive material layer covering an inner wall of the via, the conductive material layer being electrically connected to the first external circuit layer and the second external circuit layer; and a filler material filling the via, wherein the first external circuit layer and the second external circuit layer respectively cover an upper surface and a lower surface of the filler material, and the upper surface and the lower surface are opposite to each other.

10. The circuit board structure according to claim 5, wherein each of the first ground path and the second ground path is a substantially U-shaped path.

* * * * *